(12) United States Patent
del Rosso et al.

(10) Patent No.: US 9,590,334 B2
(45) Date of Patent: Mar. 7, 2017

(54) SOLDERLESS ELECTRICAL INTERCONNECTIONS IN A HIGH SPEED PHOTONIC PACKAGE

(71) Applicant: BRPHOTONICS PRODUTOS OPTOELETRONICOS LTDA., Campinas (BR)

(72) Inventors: Giovanni del Rosso, Caltignaga (IT); Luis Henrique Hecker de Carvalho, Campinas (BR); Júlio César Rodrigues Fernandes de Oliveira, Campinas (BR)

(73) Assignee: BRPHOTONICS PRODUTOS OPTOELETRONICOS LTDA., Campinas (BR)

( * ) Notice: Subject to any disclaimer, the term of this patent is extended or adjusted under 35 U.S.C. 154(b) by 0 days.

(21) Appl. No.: 15/204,220

(22) Filed: Jul. 7, 2016

(65) Prior Publication Data

US 2017/0018866 A1    Jan. 19, 2017

Related U.S. Application Data

(60) Provisional application No. 62/191,688, filed on Jul. 13, 2015.

(51) Int. Cl.
  *H01R 12/00*  (2006.01)
  *H01R 12/70*  (2011.01)
  *H01R 13/22*  (2006.01)

(52) U.S. Cl.
  CPC ..... *H01R 12/7076* (2013.01); *H01R 12/7005* (2013.01); *H01R 12/7017* (2013.01); *H01R 13/22* (2013.01)

(58) Field of Classification Search
  CPC .. H01R 23/722; H01R 9/096; H01R 13/2435; H01R 23/668
  USPC ......................................... 439/68, 66, 67, 91
  See application file for complete search history.

(56) References Cited

U.S. PATENT DOCUMENTS

| 6,062,870 | A | 5/2000 | Hopfer et al. | |
| 7,438,557 | B1 * | 10/2008 | Plucinski | H01R 13/22 439/65 |
| 7,520,761 | B2 | 4/2009 | Weiss | |
| 7,534,111 | B1 * | 5/2009 | Plucinski | H01R 13/22 439/65 |

(Continued)

*Primary Examiner* — Phuongchi T Nguyen
(74) *Attorney, Agent, or Firm* — Hamre, Schumann, Mueller & Larson, P.C.

(57) ABSTRACT

An assembly that provides solderless electrical interconnection between two devices provided with electrical contact lands that are distributed in plane Land Grid Arrays (LGA's). One of the devices can be a package containing an electronic or opto-electronic device and the other device can be a PCB. The alignment of the lands of the LGA's is provided by guides that include a frame having vertical walls and centering pins inserted into metallized via-holes provided in the PCB, the dimensions of the frame allowing the sliding insertion and extraction of the package. Electrical connection between the lands of the two LGA's is provided by a contactor pad placed between the package and the PCB. The assembly includes a cover removably attached to the frame by a locking mechanism, the cover being provided with one or more elastic members which exert a downward force over the package compressing it against the contactor pad.

17 Claims, 5 Drawing Sheets

(56) References Cited

U.S. PATENT DOCUMENTS

| | | | | |
|---|---|---|---|---|
| 7,537,461 B2* | 5/2009 | Rathburn | ............ | H01R 13/2414 |
| | | | | 439/66 |
| 7,857,631 B2* | 12/2010 | Cavegn | ................ | H05K 7/1069 |
| | | | | 439/65 |
| 8,430,676 B2* | 4/2013 | Dang | ................. | G01R 31/2889 |
| | | | | 439/66 |
| 2004/0002233 A1 | 1/2004 | Advocate et al. | | |
| 2008/0182436 A1* | 7/2008 | Rathburn | ............ | H01R 13/2414 |
| | | | | 439/78 |
| 2008/0282539 A1 | 11/2008 | Brodsky et al. | | |
| 2010/0167559 A1* | 7/2010 | Cavegn | ................ | H05K 7/1069 |
| | | | | 439/65 |
| 2014/0342583 A1 | 11/2014 | McHugh | | |

* cited by examiner

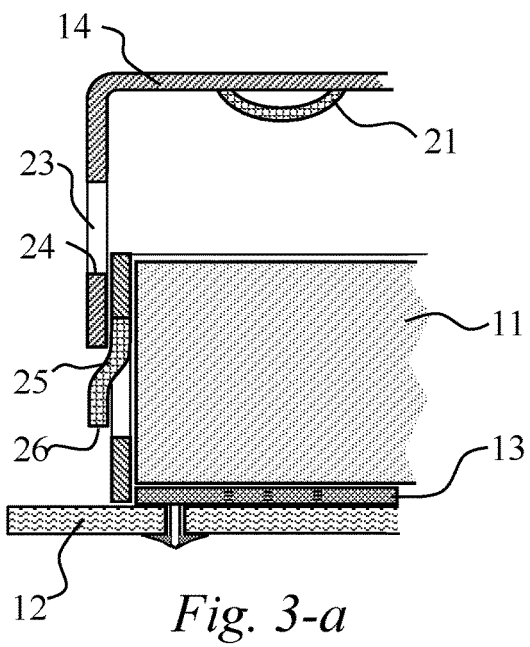
*Fig. 3-a*
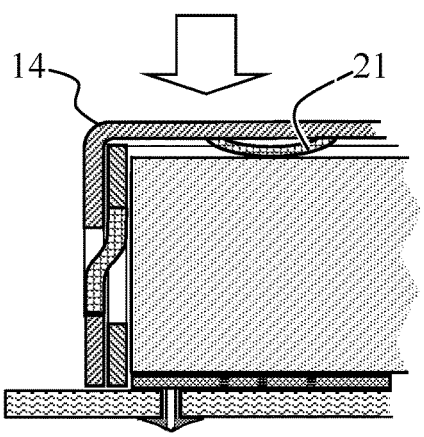
*Fig. 3-b*
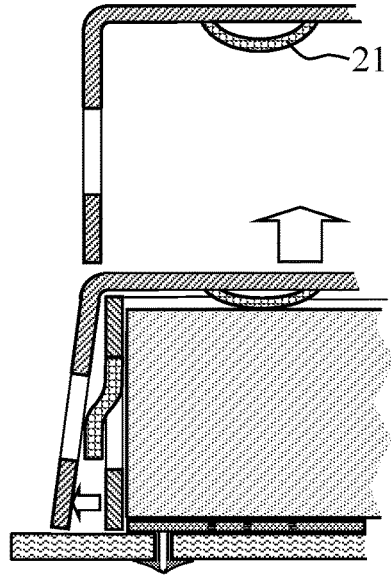
*Fig. 3-c*
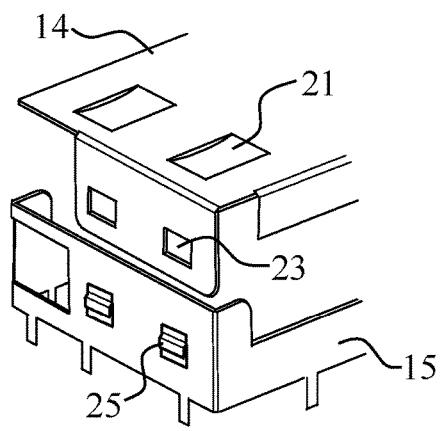
*Fig. 3-d*
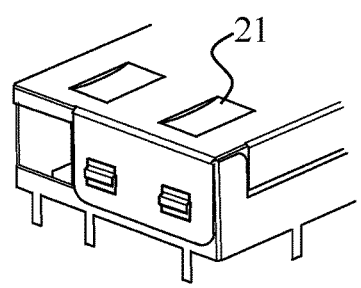
*Fig. 3-e*

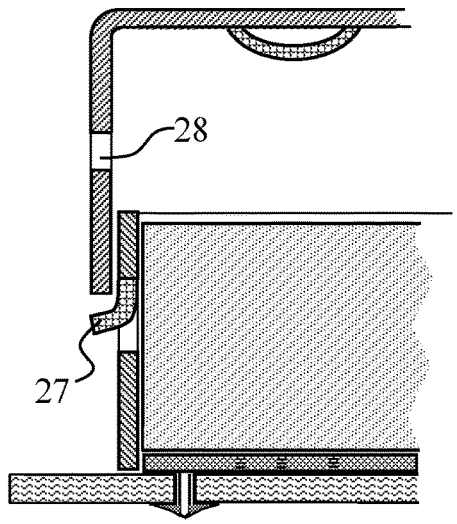
Fig. 4-a
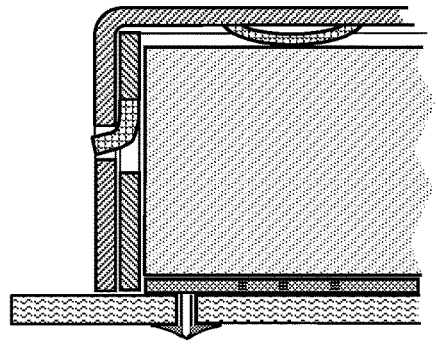
Fig. 4-b
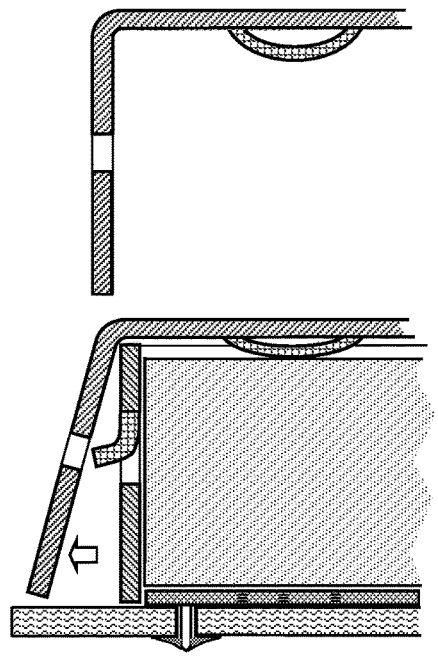
Fig. 4-c
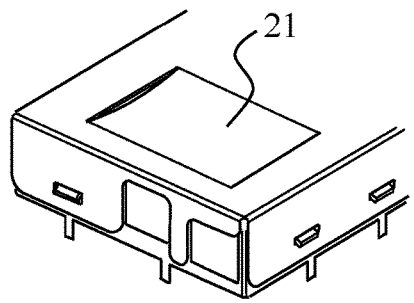
Fig. 4-d

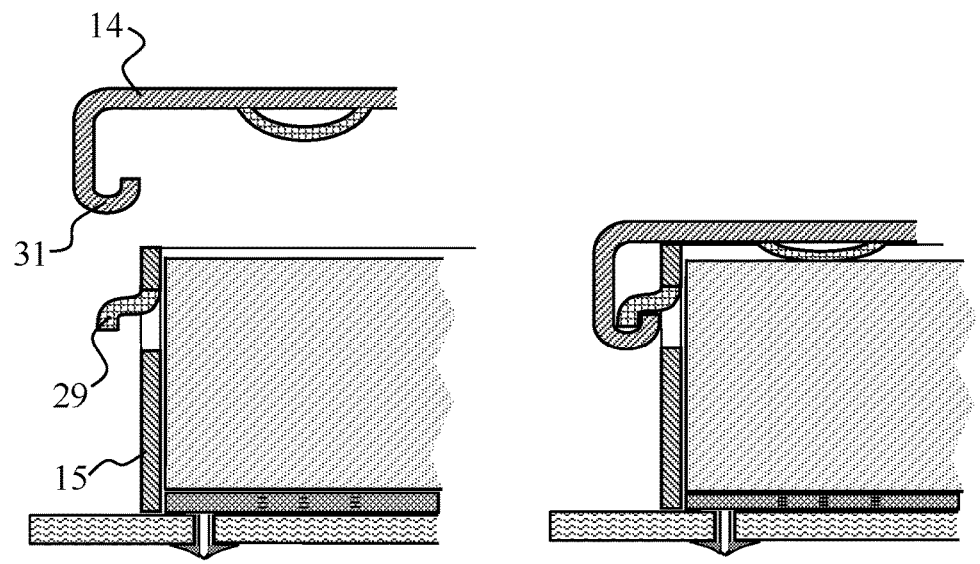
Fig. 5-a        Fig. 5-b
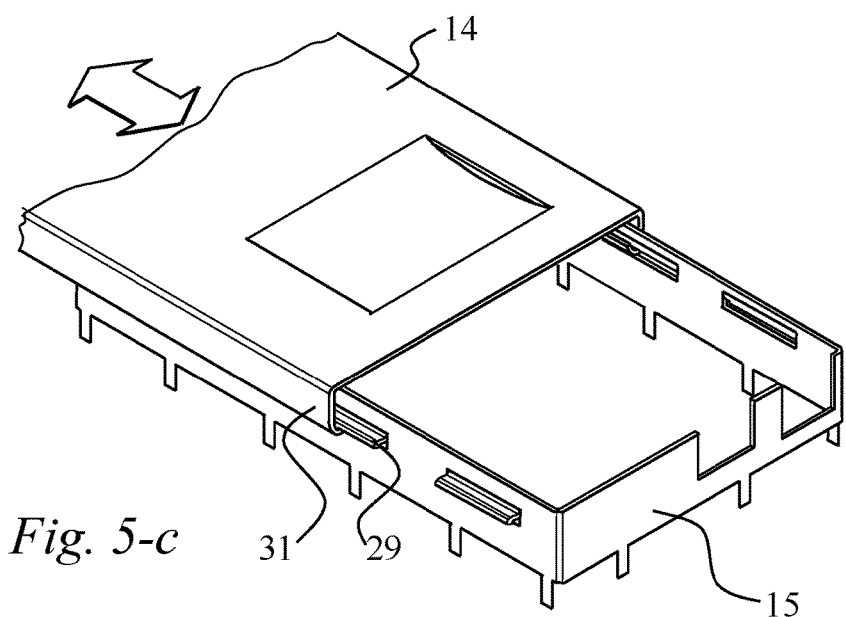
Fig. 5-c

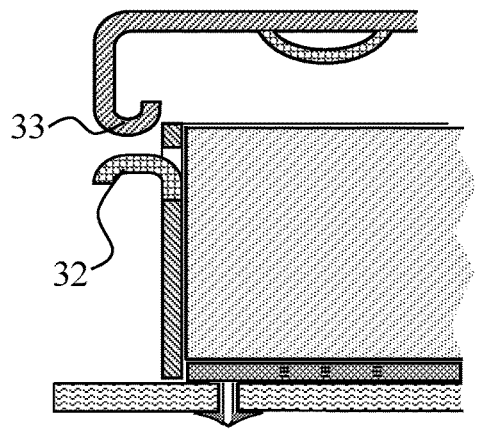
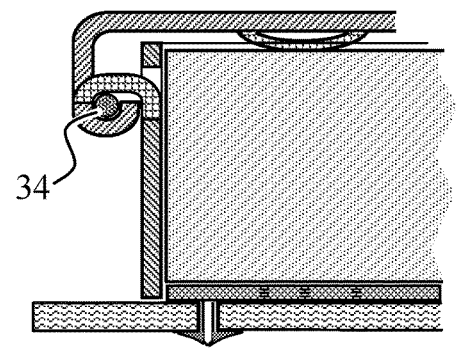
*Fig. 6-a*        *Fig. 6-b*
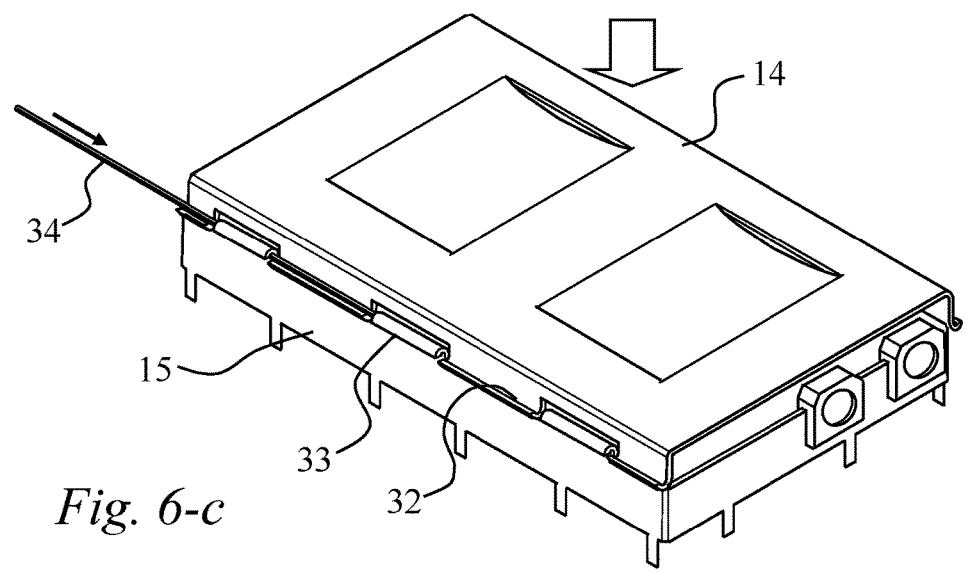
*Fig. 6-c*

SOLDERLESS ELECTRICAL INTERCONNECTIONS IN A HIGH SPEED PHOTONIC PACKAGE

BACKGROUND OF THE INVENTION

Field of the Invention

The present invention relates in general to the electrical connector field. More particularly, the present invention relates to providing a conductive path between two devices provided with electrical contacts distributed on a surface. Most particularly, the present invention relates to providing a solderless electrical interconnection between a first device and a second device, said first device comprising—but not limited to—a photonic package such as a Transmitter Optical Sub-Assembly (TOSA) and said second device comprising—but not limited to—a printed circuit board (PCB).

Background Art

Electrical connectors are in widespread use in the electronics industry. In many electronic and opto-electronic devices and systems a module such as a central processor unit (CPU), memory module, application-specific integrated circuit (ASIC) or optical and opto-electronic sub-assemblies (such as a TOSA), must be connected to a printed circuit board (PCB). In connecting such module to a PCB, a plurality of individual electrical contacts provided on the base of the module must be connected to a plurality of corresponding individual electrical contacts provided on the PCB surface. This set of contacts on the PCB dedicated to contacting the module contacts is known as a land grid array (LGA). Rather than permanently soldering the electronic module contacts to the LGA site, it is desirable to use connecting means that allow the module to be installed to and removed from the LGA site.

Interconnecting devices conjoined with LGA sites provide the user with the flexibility to upgrade or replace electronic modules during the manufacturing cycle and in the field. A trend in the electronics industry has been to increase both the quantity of lands in LGA sites and the density thereof, i.e., the number of contacts per unit area at the LGA site. Another trend in the electronics industry is to reduce the insertion force necessary to insert the electronic module into the LGA connector.

One type of LGA connector that has proven to be very reliable incorporates resilient wire bundles, which provide conductive paths between pads of two devices, such as a TOSA and a PCB or between two PCB's.

For example, U.S. Pat. No. 6,062,870 (Hopfer et al.)—ELECTRICAL INTERCONNECTS, discloses an electrical interposer that incorporates resilient wire bundles retained in holes of a flat carrier by compressive frictional engagement with a central section of the sidewall of each of the holes. In use, the carrier is placed between the two components to be interconnected—such as a PCB and a TOSA—and the resilient wire bundles provide conductive paths between the corresponding pads or lands of said components, which are held in an opposing relation. A problem with this device is that one or more of the resilient wire bundles may be jarred loose and fall out from the interposer during transit or handling, resulting in an open circuit between the two components. Another problem is that the resilient wire bundle, instead of being jarred completely out of the interposer, is only partially loose in such a way that, when compressed between the two components, the resilient wire bundle bends over and makes contact with an adjacent resilient wire bundle or an adjacent land, resulting in a short circuit.

US patent application No. 2004002233 (Advocate et al.)—METHOD OF ASSEMBLING AN INTERCONNECT DEVICE ASSEMBLY AND APPARATUS THEREFOR discloses a method of assembling an interconnect device assembly which consists of cylindrical resilient wire bundles captured with a carrier. The interconnect device assembly is placed in a fixture and the ends of the resilient wire bundles are deformed by shaping dies in the fixture so that the resilient wire bundles now have a dog bone shape. The dog bone shape of the resilient wire bundles prevents the resilient wire bundles from being partially or totally dislodged during handling and transit. However, one or more of the shaping dies may insufficiently deform the resilient wire bundle and thereby fail to prevent the same from being dislodged. Also, the shaping dies may inconsistently deform the resilient wire bundles (i.e., some shaping dies will under-penetrate the resilient wire bundles while other shaping dies will over-penetrate). The resulting unequal resilient wire bundle height increases the likelihood that one or more open circuits will occur when the resilient wire bundles are compressed between two electronic substrates.

US patent application No. 2008282539 (Brodsky et al.)—ELECTRICALLY CONNECTING TWO SUBSTRATES USING A RESILIENT WIRE BUNDLE CAPTURED IN AN APERTURE OF AN INTERPOSER BY A RETENTION MEMBER discloses a method and apparatus for electrically connecting two substrates using resilient wire bundles captured in apertures of an interposer by a retention film. The interposer comprises an electrically non-conductive carrier having two surfaces and apertures extending from surface to surface. A resilient wire bundle is disposed in each aperture. An electrically non-conductive retention film is associated with one or both surfaces of the carrier and has an orifice overlying each aperture. The width of each orifice is smaller than that of the underlying aperture to thereby enhance retention of the resilient wire bundle within the aperture. Pin contacts of one or both of the substrates make electrical contact with the resilient wire bundles by extending through the orifices of the retention film and partially through the apertures. In one embodiment, the interposer is a land grid array (LGA) connector that connects an electronic module and a printed circuit board (PCB). A problem with electrical connectors that incorporate resilient wire bundles is that the strands of the resilient wire bundles are not very robust. For example, the strands of resilient wire bundles are prone to spreading or "mushrooming" upon repeated insertions. If a resilient wire bundle is sufficiently mushroomed, an open circuit or near-open circuit will result when the mushroomed resilient wire bundle is subsequently compressed between two electronic substrates. This occurs because mushrooming can undesirably limit the compressive force on the resilient wire bundle and thereby increase electrical resistance through the resilient wire bundle to the point where an open circuit or near-open circuit is created. Moreover, the strands of resilient wire bundles can snag on mating features during insertion and withdrawals. If either a snagged strand of a resilient wire bundle or a mushroomed resilient wire bundle subsequently makes contact with an adjacent resilient wire bundle or an adjacent contact on the electronic substrate, a short circuit will result. Such a short circuit can catastrophically damage one or both of the electronic substrates being interconnected.

US patent application No. 2014342583 (McHugh)—LOW PROFILE ELECTRICAL CONNECTOR HAVE A FPC discloses a connector for electrically connecting a chip module to a PCB, comprising an insulative housing with a plurality of terminals therein, the insulative housing comprising a substrate and a sidewall extending upwardly, said substrate being provided with a plurality of through-holes and a flex film (FPC) located under the substrate, wherein the contact elements to the PCB pads consist of a plurality of solder balls fused into the bottom side of the vias of the FPC. One problem associated with this connector is the fact that it does not compensate for surface irregularities between the adjoined components. Moreover, the solder balls are subjected to distortion with repeated use of the connector, resulting in inadequate contacts between some balls and the pads, or even an open circuit.

It should therefore be apparent that a need exists for an enhanced assembly for connecting two substrates in a reliable way.

OBJECTS OF THE INVENTION

In view of the above, it is an aim of the invention to provide an assembly for electrically interconnecting in a reliable way a first component provided with a LGA to a second component provided with a LGA corresponding to the LGA of the first component. Said first or second components may comprise electronic or opto-electronic devices.

Another object of the invention is to provide an assembly that does not require soldering of the contacting elements.

Another object is to provide an assembly that withstands a great number of connecting and disconnecting operations while maintaining the reliability of the contacts.

SUMMARY OF THE INVENTION

The foregoing and other objects of the invention are met generally by an assembly comprising a removable anisotropic contactor pad interposed between a first and a second substrates held in an opposing relation, each provided with a plane array of conducting lands (LGA's), said arrays being symmetrical so that the lands in the array of the first substrate are fronted on the lands in the array of the second substrate, the precise mutual alignment of both substrates being provided by mechanical guiding and clamping means.

According to another feature of the invention, said mechanical guiding and clamping means comprising an alignment frame and a cover.

According to another feature of the invention said first substrate is part of an electronic, electro-optic or optic device housed in an enclosure with vertical sidewalls.

According to another feature of the invention said alignment frame's internal dimensions match the external dimensions of said enclosure, which is inserted and withdrawn by a sliding movement.

According to another feature of the invention the precise positioning of said frame with respect to the second substrate is provided by centering elements, which are permanently attached to said second substrate.

According to another feature of the invention said second substrate is a printed circuit board—PCB.

According to another feature of the invention said cover is retained to said frame by a locking mechanism.

According to another feature of the invention said locking mechanism comprises first latching means provided in the alignment frame cooperating with second latching means provided in said cover.

According to another feature of the invention said cover—which is superimposed on said enclosure—comprises elastic means that provide a force compressing said enclosure against said PCB, when said cover is locked on said frame.

BRIEF DESCRIPTION OF THE DRAWINGS

The foregoing and other features and advantages of the present invention will be apparent from the following more particular description of a preferred embodiment of the present invention, as illustrated in the accompanying drawings in which:

FIG. 3-a to 3-e show a first embodiment of the locking mechanism.

FIG. 4-a to 4-d show a second embodiment of the locking mechanism.

FIG. 5-a to 5-c show a third embodiment of the locking mechanism.

FIG. 6-a to 6-c show a fourth embodiment of the locking mechanism.

DETAILED DESCRIPTION

Figure 1:
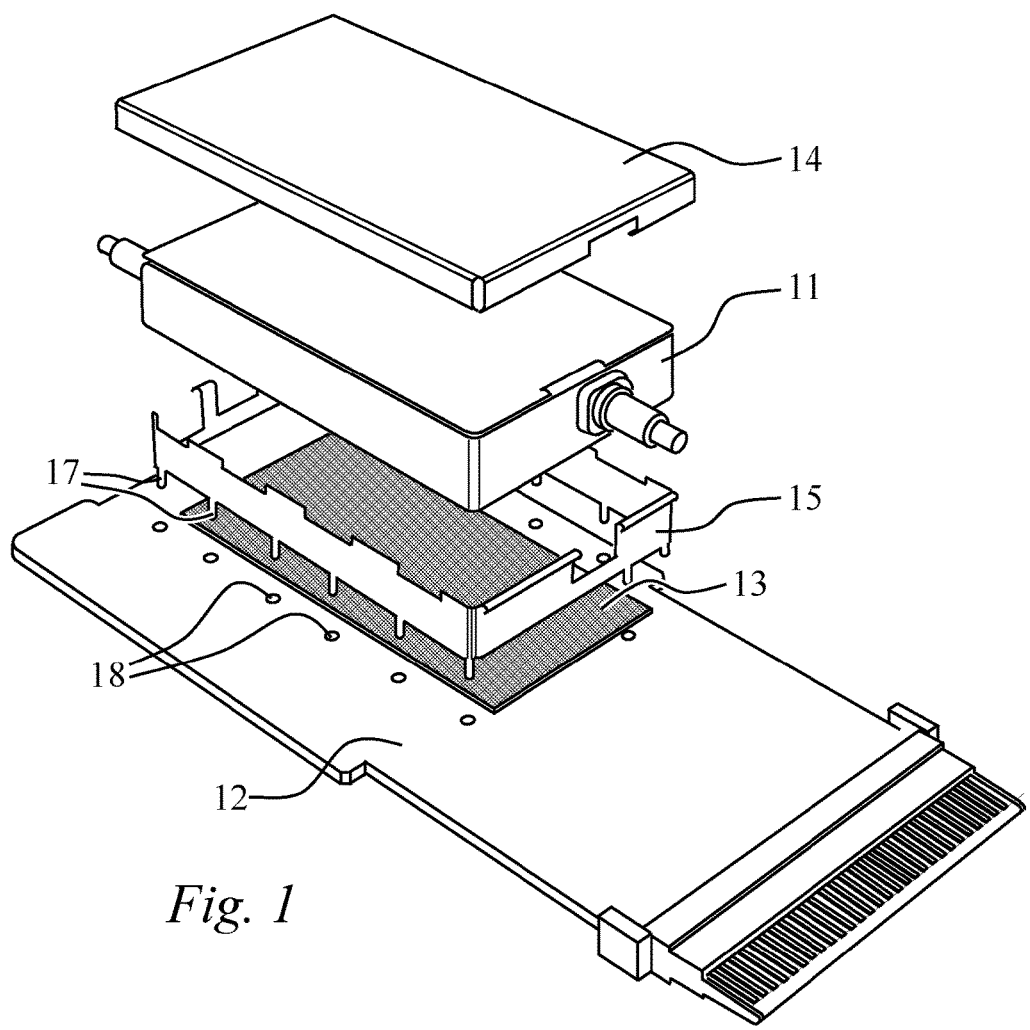
FIG. 1 is an exploded perspective view of a preferred embodiment of the invention.
Figure 2:
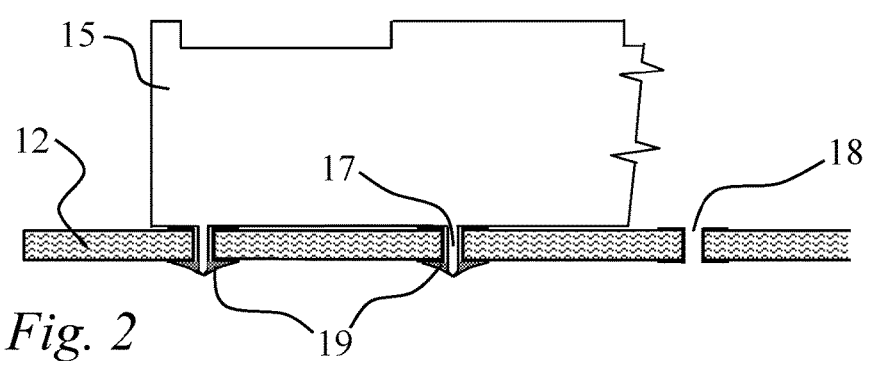
FIG. 2 is a simplified elevation view showing the attachment of the frame to the second substrate.

FIG. 1 shows the use of the invention in the connection between a TOSA device 11 and a PCB 12. The contact between the lands of the TOSA device and the PCB is provided by an interposed anisotropic contactor pad 13, such as described in U.S. Pat. No. 7,520,761 (Weiss)—SEPARABLE ELECTRICAL INTERCONNECT WITH ANISOTROPIC CONDUCTIVE ELASTOMER AND ADAPTOR WITH CHANNEL FOR ENGAGING A FRAME—herein incorporated by reference in its entirety and marketed by Paricon Technologies Corp. under the trade name of Pari-Poser®.

As disclosed in the aforementioned patent document, said separable electrical connector provide solderless high frequency electrical interconnections between electronic or optoelectronic modules and electrical PCB's, and comprise a plurality of vertically-aligned columns of silver-plated nickel particles uniformly distributed in a thin sheet of silicone, said columns providing electrically conducting paths between the upper and the lower surfaces of said silicone sheet.

When a PariPoser® pad is compressed between two flat LGA's the silicone undergoes an elastic deformation allowing the columns' ends to contact the lands of both substrates and providing an electrical interconnection thereof. The compression force is provided by elastic means situated in the cover 14 that apply said force to the top of the enclosure 11 housing the TOSA device. As shown in FIG. 3 and following, said elastic means may consist of springs 21 molded by shaping the main surface of the cover 14. Conversely, the elastic force may be provided by pads of elastic PU foam or equivalent attached to the under surface of said covers.

As shown in FIG. 1, the instant invention comprises an aligning member to insure that the lands of the first and second substrate are precisely aligned. This member consists of a metallic frame 15, which comprises vertical sidewalls wherein the clearance between said walls and the enclosure 11 allow the latter to be inserted or extracted into or from said frame by sliding.

The precise positioning of said metallic frame 15 and its attachment to PCB 12 is provided by centering pins 17 which, after being inserted into metallized vias 18 in said PCB 12, are kept in place by soldering 19 using an industry-standard process.

According to the instant invention, the cover 14 is removably attached to the frame 15 by means of various types of locking mechanisms. Said mechanisms, which are shown FIG. 3 and following, are able to indefinitely maintain spring member(s) 21 loaded (latching mode) to properly compress LGA pads against the interposer and the PCB. The same mechanisms also allow spring members 21 to be decompressed (un-latching mode) so that the cover can be removed as well as the LGA package.

FIG. 3-a to 3-e describe a first embodiment of the locking mechanism, in which comprises an outwards bent projection 25 in the sidewall of the frame 15, whose distal end 26 engages the lower border 24 of an opening 23 in the cover sidewall when said cover is pressed downwards as shown in FIG. 3-b. As shown in this figure, besides holding the cover 14 in place, said engagement insures that spring member 21 exerts a downward pressure on enclosure 11 and contactor pad 13. FIG. 3-c shows removal of the cover 14 by pushing outward its sidewalls, in order to disengage latching elements 23 and 25. As the cover is lifted, the spring member 21 returns to its decompressed state.

FIG. 4-a to 4-d show a second embodiment of the locking mechanism, which is similar to the first embodiment, but differing in the shape of the projection 27.

A third embodiment of the locking mechanism is shown in FIGS. 5-a, 5-b and 5-c, in which the cover is applied or withdrawn by a sliding movement, as indicated by the arrow in FIG. 5-c. As described in FIG. 5-a, the edges of the cover 14 are shaped as channels 31 which fit over tongues 29 in the sidewalls of frame 15 when said cover slides over the frame.

FIGS. 6-a, 6-b and 6-c show a fourth embodiment of the locking mechanism, in which upward channels 33 in the edges of cover 14 are interspersed with downward channels 32 in the frame's 15 sidewalls. As indicated by the arrow, cover 14 is first pressed down so that said channels become aligned, allowing the insertion of a retaining stainless steel wire 34.

Regarding the materials used in the spring elements as well as in the frame and cover, sheet metal with thickness ranging between 0.08 mm and 0.8 mm can be used; the metal alloys being selected from the following:

Phosphor Bronze (Cu alloy with Sn 3.5 to 10%+P up to 1%);
Copper Beryllium (Cu alloy with Be 0.5 up to 3%);
Various spring steel alloy compositions;
Alpaca (usual formulation is Cu 60%, Ni 20%, Zn 20%).
Other suitable materials of alloys may be used either in the frame or in the cover.

Spring members 21 can be obtained by coining or photochemical machining (but not limited to these known processes) on the cover 14 itself or added as separate parts.

The guiding frame herein disclosed offers the advantage of allowing a rapid change of LGA modules, i.e., for upgrades or repairs. The LGA package can be quickly removed many times by unlocking the cover 14 from the frame member 15.

The clamping arrangement of the invention shows a minimum footprint when compared with LGA photonic package footprints, substantiating the advantage of minimizing the pitch when multiple LGA packages must be assembled on the same PCB. This is a noteworthy feature when assembling highly compact packages and miniaturized modules such as CFP2, CPF4 or QSFP.

The invention claimed is:

1. An assembly that provides solderless electrical interconnections between two devices provided with electrical contact lands that are distributed in plane land grid arrays (LGA's) symmetrically held in an opposing relation so that the contact lands on the LGA of a first one of the devices are fronted on the contact lands on the LGA of a second one of the devices, comprising:
   the first device is housed in a first enclosure having vertical sidewalls;
   the second device is a printed circuit board (PCB);
   an anisotropic contactor pad between the contact lands of the first device and the contact lands of the second device;
   a guide frame attached to the PCB; and
   at least one elastic member situated in a cover superimposed over the first enclosure and removably attached to the guide frame by a locking mechanism.

2. The assembly according to claim 1, wherein the at least one elastic member comprises at least one spring integrally formed on the cover and formed from the material that forms the cover.

3. The assembly according to claim 1, wherein the at least one elastic member comprises at least one pad of elastic foam attached to a surface of the cover that faces the first enclosure.

4. The assembly according to claim 1, wherein the cover includes at least one side wall; and the locking mechanism includes at least one element located on the side wall of the cover that cooperates with at least one element on the guide frame.

5. The assembly according to claim 1, wherein the anisotropic contactor pad comprises a plurality of electrically conducting columns of aligned silver-plated nickel particles, the columns extending between upper and lower surfaces of a silicone sheet.

6. The assembly according to claim 5, wherein the at least one elastic member is positioned and arranged to apply a compressive force to the first enclosure so that upper and lower extremities of the electrically conducting columns of the anisotropic contactor pad are electrically contacted with the contact lands of the first device and the contact lands of the second device.

7. The assembly according to claim 1, wherein the guide frame comprises a metallic frame formed from a metallic sheet having vertical walls defining an aperture into which the first enclosure slidably fits.

8. The assembly according to claim 7, wherein the metallic frame includes centering pins that are inserted in metalized via-holes provided in the PCB.

9. The assembly according to claim 8, wherein the centering pins are soldered within the metalized via-holes.

10. An assembly that provides solderless electrical interconnections between first and second devices provided with electrical contact lands that are distributed in plane land grid arrays (LGA's) symmetrically held in an opposing relation so that the contact lands on the LGA of first device are fronted on the contact lands on the LGA of the second device, comprising:
   the first device is housed in a first enclosure having sidewalls;
   an anisotropic contactor pad between the contact lands of the first device and the contact lands of the second device;
   a guide frame attached to the second device, the first enclosure being removably disposed within the guide frame;
   a cover removably attached to the guide frame by a locking mechanism so that the cover covers the first enclosure; and at least one elastic member situated in the cover and engaged with the first enclosure when the cover is removably attached to the guide frame wherein the at least one elastic member applies a biasing force to the first enclosure resiliently biasing the contact lands of the first device into engagement with the anisotropic contactor pad.

11. The assembly according to claim 10, wherein the at least one elastic member comprises at least one spring integrally formed on the cover and formed from the material that forms the cover.

12. The assembly according to claim 10, wherein the at least one elastic member comprises at least one pad of elastic foam attached to a surface of the cover that faces the first enclosure.

13. The assembly according to claim 10, wherein the cover includes side walls; and the locking mechanism includes at least one locking element located on one of the side walls of the cover that cooperates with at least one locking element on the guide frame.

14. The assembly according to claim 10, wherein the anisotropic contactor pad is disposed within the guide frame between the first enclosure and the second device.

15. The assembly according to claim 10, wherein the guide frame comprises a metallic frame formed from a metallic sheet having walls that define a receptacle into which the first enclosure slidably fits.

16. The assembly according to claim 15, wherein the metallic frame includes centering pins that are inserted in metalized via-holes provided in the second device.

17. The assembly according to claim 16, wherein the centering pins are soldered within the metalized via-holes.

* * * * *